United States Patent
Hsiao et al.

(10) Patent No.: US 8,143,912 B2
(45) Date of Patent: Mar. 27, 2012

(54) IMPEDANCE ADJUSTMENT CIRCUIT FOR ADJUSTING TERMINAL RESISTANCE AND RELATED METHOD

(75) Inventors: Chiao-Wei Hsiao, Taichung (TW); Sih-Ting Wang, Kaohsiung County (TW); Tung-Cheng Hsin, Hsinchu (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 339 days.

(21) Appl. No.: 12/577,211

(22) Filed: Oct. 12, 2009

(65) Prior Publication Data

US 2011/0012689 A1    Jan. 20, 2011

(30) Foreign Application Priority Data

Jul. 20, 2009   (TW) .............................. 98124409 A

(51) Int. Cl.
   *H03K 17/16*   (2006.01)
(52) U.S. Cl. .............................. 326/30; 326/27; 326/34
(58) Field of Classification Search .............. 326/26–27, 326/30–34, 82–87; 327/108–109, 112
   See application file for complete search history.

(56) References Cited

U.S. PATENT DOCUMENTS

| 7,148,720 B2 * | 12/2006 | Chen ................................ 326/30 |
| 7,368,936 B2 | 5/2008 | Huang |
| 7,479,800 B1 * | 1/2009 | Vullaganti et al. .............. 326/30 |
| 2003/0102932 A1 | 6/2003 | Lee et al. |
| 2006/0044007 A1 * | 3/2006 | Lou ................................... 326/30 |

FOREIGN PATENT DOCUMENTS

TW           538602        6/2003

* cited by examiner

Primary Examiner — Shawki S Ismail
Assistant Examiner — Jany Tran
(74) Attorney, Agent, or Firm — Winston Hsu; Scott Margo

(57) ABSTRACT

An impedance adjustment circuit for adjusting a terminal resistance includes a resistance evaluation unit and a terminal resistor unit. The resistance evaluation unit is utilized for evaluating a ratio of an off-chip resistor and a basic resistor to generate a control signal by a successive approximation method. The terminal resistor unit is coupled to the resistance evaluation unit, and is utilized for deciding a number of shunt basic resistors to provide a matched terminal resistance according to the control signal.

19 Claims, 7 Drawing Sheets

IMPEDANCE ADJUSTMENT CIRCUIT FOR ADJUSTING TERMINAL RESISTANCE AND RELATED METHOD

BACKGROUND OF THE INVENTION

1. Field of the Invention

The present invention relates to an impedance adjustment circuit for adjusting terminal resistance and related method, and more particularly, to an impedance adjustment circuit evaluating the ratio of an off-chip resistor to a unit resistor by a successive approximation method to adjust the terminal resistance and related method.

2. Description of the Prior Art

For high-speed transmission interface, in order to optimize energy transmission efficiency and avoid unnecessary reflection during transmission, output resistance of a transmission terminal, input resistance of a reception terminal and characteristic resistance of transmission media, etc. in a signal transmission path are usually strictly limited to meet a certain standard value. For example, the normal characteristic resistance is 50 ohm or 75 ohm, and thus terminal resistance of a receiver circuit has to be designed to 50 ohm or 75 ohm as well.

However, on-chip resistors are usually affected by process variations to have ±15% error margin, and cannot achieve precise resistance value. Therefore, for the purpose of impedance match, the prior art usually utilizes an impedance matching circuit for adjusting the terminal resistance of the integrated circuit to match the characteristic resistance of the transmission media. In order to obtain more accurate terminal resistance, most impedance matching circuit fine tunes the resistance by precise off-chip resistors to meet the signal quality requirement, as disclosed in U.S. Pat. No. 7,368,936 and ROC Patent No. 538,602. However, the said patents both give a certain voltage on the off-chip resistor and consume enormous circuit area.

SUMMARY OF THE INVENTION

Therefore, the present invention aims at providing an impedance adjustment circuit for adjusting terminal resistance and related method.

The present invention discloses an impedance adjustment circuit for adjusting terminal resistance. The impedance adjustment circuit includes a resistance evaluation unit and a terminal resistor unit. The resistance evaluation unit includes a first resistor, a voltage-to-current converter, a current calculation unit, a second resistor, a comparator and a successive approximation register (SAR). The voltage-to-current conversion unit is coupled to a reference voltage and the first resistor, and is utilized for converting the reference voltage to a reference current through the first resistor. The current calculation unit is coupled to the voltage-to-current conversion unit, and is utilized for generating a comparative current according to the reference current and a control signal, wherein the comparative current is adjusted by the control signal. The second resistor is coupled to the current calculation unit, and is utilized for converting the comparative current to a comparative voltage. The comparator is coupled to the second resistor and the reference voltage, and is utilized for generating a comparing result according to the comparative voltage and the reference voltage. The SAR is coupled to the comparator and the current calculation unit, and is utilized for performing a successive approximation operation according to the comparing result to set the control signal until a ratio of the comparative current to the reference current approximates a ratio of the first resistor to the second resistor. The terminal resistor unit is coupled to the resistance evaluation unit, and includes a plurality of unit resistors. The terminal resistor unit determines the number of parallel-connected resistors of the plurality of resistors according to the control signal to provide matched terminal resistance.

The present invention also discloses a method for adjusting terminal resistance. The method includes steps of converting a reference voltage to a reference current through a first resistor; generating a comparative current according to the reference current and a control signal, wherein the comparative current is adjusted by the control signal; converting the comparative current to a comparative voltage through a second resistor; generating a comparing result according the comparative voltage and the reference voltage; performing a successive approximation operation according to the comparing result to set the control signal until a ratio of the comparative current to the reference current approximates a ratio of the first resistor to the second resistor; and determining the number of parallel-connected resistors of a plurality of unit resistors according to the control signal to provide a matched resistance.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
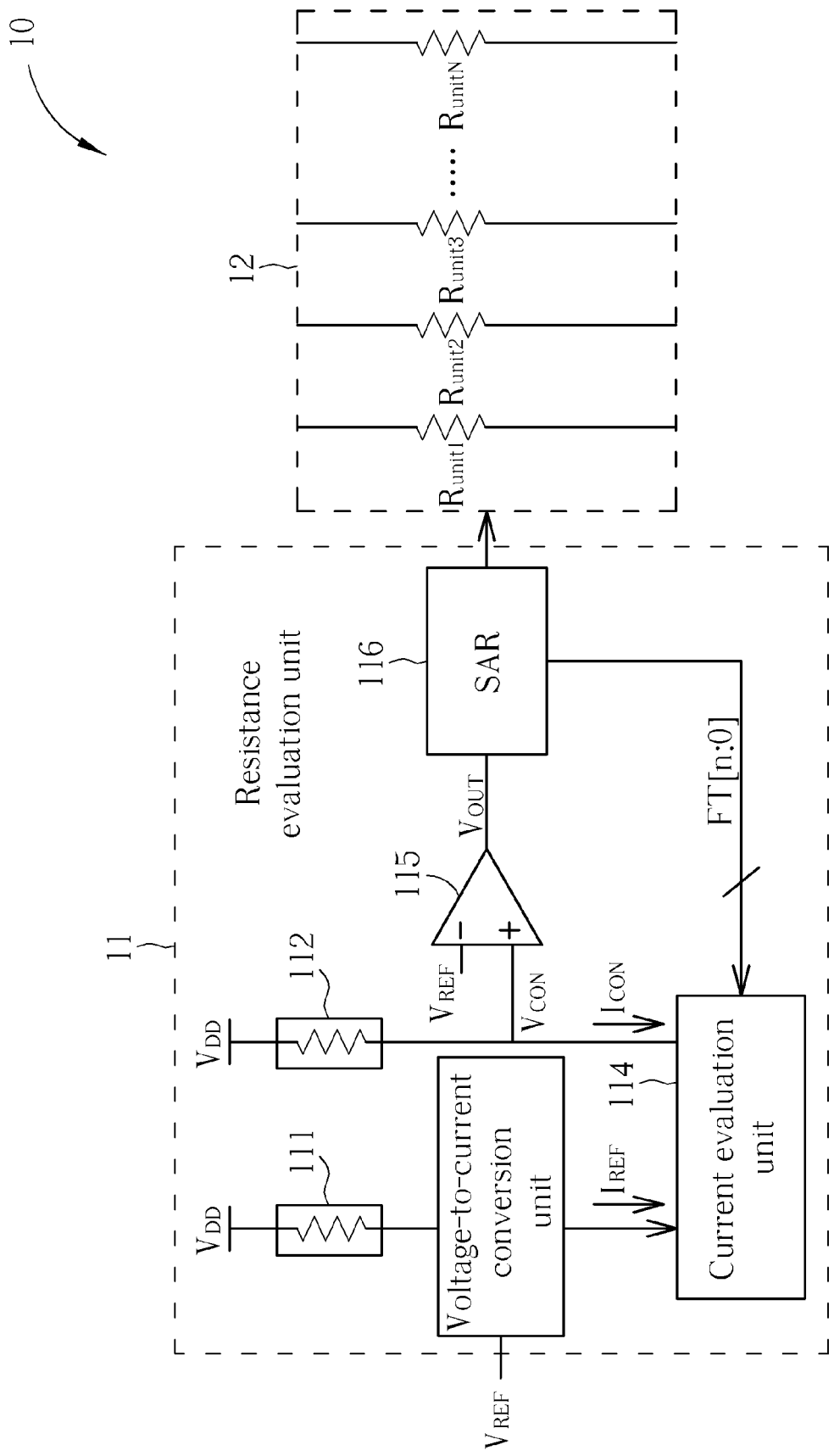
FIG. 1 is a schematic diagram of an impedance adjustment circuit according to the present invention.

Please refer to FIG. 1. FIG. 1 is a schematic diagram of an impedance adjustment circuit 10 according to the present invention. The impedance adjustment circuit 10 is utilized for adjusting resistance of a terminal resistor, and includes a resistance evaluation unit 11 and a terminal resistor unit 12. The resistance evaluation unit 11 includes resistors 111 and 112, a voltage-to-current converter 113, a current calculation unit 114, a comparator 115 and a successive approximation register (SAR) 116. The voltage-to-current conversion unit 113 is coupled to a reference voltage $V_{REF}$ and a resistor 111, and is utilized for converting the reference voltage $V_{REF}$ to a reference current $I_{REF}$ through the resistor 111. The current calculation unit 114 is coupled to the voltage-to-current conversion unit 113, and is utilized for generating a comparative current $I_{CON}$ according to the reference current $I_{REF}$ and a control signal FT [n:0], wherein the comparative current $I_{CON}$ is adjusted by the control signal FT [n:0]. The resistor 112 is coupled to the current calculation unit 114, and is utilized for converting the comparative current $I_{CON}$ to a comparative voltage $V_{CON}$. The comparator 115 is coupled to the resistor 112 and the reference voltage $V_{REF}$, and is utilized for generating a comparing result $V_{OUT}$ according to the comparative voltage $V_{CON}$ and the reference voltage $V_{REF}$. The SAR 116 is coupled to the comparator 115 and the current calculation unit 114, and is utilized for performing a successive approximation operation according to the comparing result $V_{OUT}$ to set the control signal FT [n:0] until a ratio of the comparative current $I_{CON}$ to the reference current $I_{REF}$ approximates a ratio of the resistor 111 to the resistor 112. The terminal resistor unit 12 is coupled to the resistance evaluation unit 11, and includes unit resistors $R_{unit1}$~$R_{unitN}$. The terminal resistor unit 12 determines the number of the parallel-connected unit resistors $R_{unit1}$~$R_{unitN}$ according to the control signal FT [n:0] to provide matched terminal resistance.

In an embodiment of the present invention, the resistor 111 and the unit resistors $R_{unit1}$~$R_{unitN}$ have the same impedance value and process variation, while the resistor 112 is an off-chip resistor. In another embodiment of the present invention, the resistor 111 can also be realized by an off-chip resistor, while the resistor 111 and the unit resistors $R_{unit1}$~$R_{unitN}$ have the same impedance value and process variations.

Therefore the impedance adjustment circuit 10 evaluates the ratio of the off-chip resistor to the on-chip unit resistor by the successive approximation method and determines the number of the parallel-connected unit resistors according to the evaluation result so as to obtain the terminal resistance matched with the characteristic resistance of the transmission media. Accordingly, the present invention can provides the best energy transmission efficiency for a high-speed data transmission interface and avoid unnecessary signal reflection during transmission.

Figure 2:
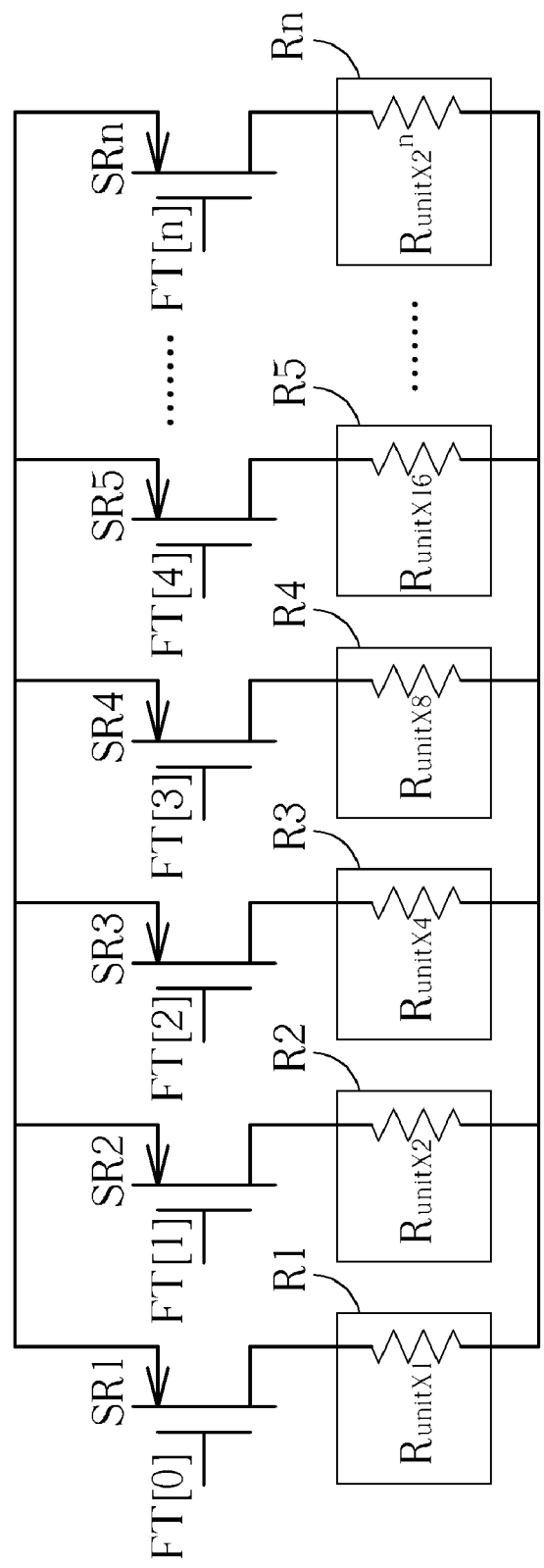
FIG. 2 is a schematic diagram of a terminal resistor unit according to an embodiment of the present invention.

Please refer to FIG. 2. FIG. 2 is a schematic diagram of a terminal resistor unit 20 according to an embodiment of the present invention. The terminal resistor unit 20 is utilized for realizing the terminal resistor unit 12 in FIG. 1, and includes resistor groups R1~Rn and switches SR1~SRn. Each of the resistor groups R1~Rn includes a distinct number of parallel-connected unit resistors $R_{unit}$. The switches SR1~SRn are individually coupled to the resistor groups R1~Rn and the current evaluation unit 11 in FIG. 1, and are utilized for controlling electrical connections between the resistor group R1~Rn and the current calculation unit 11 in FIG. 1 according to the control signal FT [n:0], such that the number of the parallel-connected unit resistors $R_{unit}$ can be determined. In the embodiment of the present invention, the number of parallel-connected resistors of the resistor group R1~Rn increases quadratically in sequence. Therefore, the impedance adjustment circuit 10 can be realized by all kinds of SARs in the prior arts or any software or hardware capable of performing binary search. Detailed illustrations can be referred to the following description.

Figure 3:
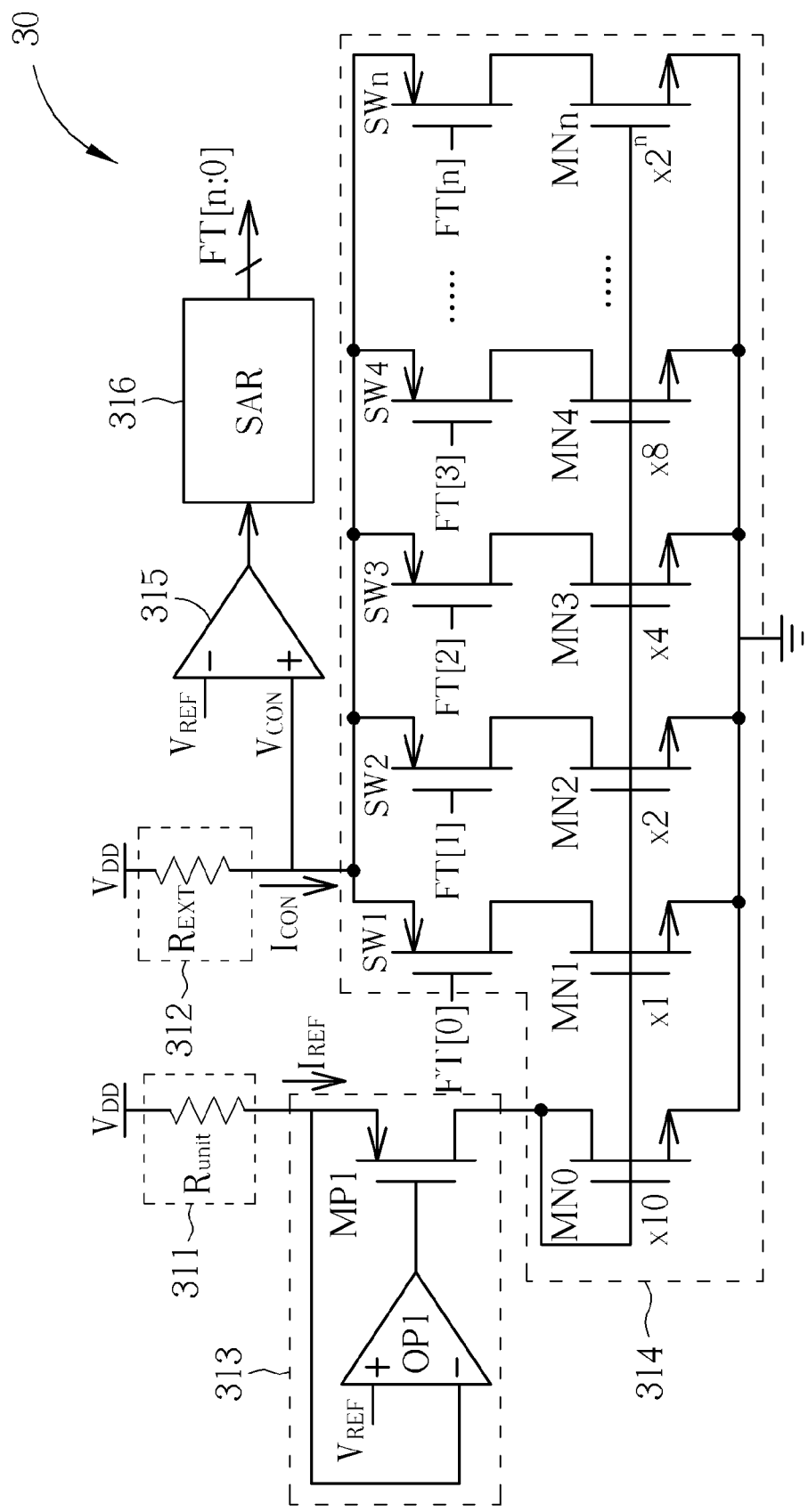
FIG. 3 is a schematic diagram of a resistance evaluation unit according to an embodiment of the present invention.

Please refer to FIG. 3. FIG. 3 is a schematic diagram of a resistance evaluation unit 30 according to an embodiment of the present invention. The current evaluation unit 30 is utilized for realizing the resistance evaluation unit 11 in FIG. 1, and includes resistors 311 and 312, a voltage-to-current conversion unit 313, a current calculation unit 314, a comparator 315 and an SAR 316. In this embodiment, the resistor 311 is realized by a same unit resistor as the unit resistor $R_{unit}$ in FIG. 2, and the resistor 312 is realized by an off-chip resistor $R_{EXT}$. The voltage-to-current conversion unit 313 includes an operation amplifier OP1 and a transistor MP1. The positive input terminal of the operation amplifier OP1 is coupled to the reference voltage $V_{REF}$, and the negative input terminal of the operation amplifier OP1 is coupled to the resistor 311. For the transistor MP1, the gate terminal is coupled to the output terminal of the operation amplifier OP1, the source terminal is coupled to the resistor 311 and the negative input terminal of the operation amplifier OP1, and the drain terminal is coupled to the current calculation unit 314. Since the operation amplifier OP1 operates in a negative feedback configuration, the virtual ground property of the operation amplifier OP1 will lock the voltage of the resistor 311 to the reference voltage $V_{REF}$. Under this condition, the voltage-to-current unit 313 can convert the reference voltage $V_{REF}$ to the reference current $I_{REF}$.

The current calculation unit 314 includes a current reception element MN0, current mirror elements MN1~MNn and switches SW1~SWn. The current reception element MN0 is utilized for receiving the reference current $I_{REF}$. The current mirror elements MN1~MNn are coupled to the current reception element MN0, and are utilized for generating mirror currents with magnitudes proportional to the reference current $I_{REF}$ according to the reference current $I_{REF}$. The switches SW1~SWn are individually coupled to the current mirror elements MN1~MNn, and are utilized for outputting corresponding mirror currents according to the control signal FT[n:0] to generate the comparative current $I_{CON}$. Preferably, the current reception element MN0 and the current mirror elements MN1~MNn are realized by transistors with distinct W/L ratio, and connected to form a conventional current mirror structure. For example, in the embodiment of the present invention, the W/L ratio of the current reception element MN0 can be set M times the W/L ratio of the current mirror element MN1, and the W/L ratios of the current mirror elements MN1~MNn are set to increase quadratically in sequence. Accordingly, the current calculation unit 314 can control the number of units of the mirror currents through the switches SW1~SWn according to bit values of the control signal FT[n:0] to adjust the comparative current $I_{CON}$.

When the ratio of the comparative current $I_{CON}$ to the reference current $I_{REF}$ equals to the ratio of the unit resistance $R_{unit}$ to the off-chip resistance $R_{EXT}$, the comparative voltage $V_{CON}$ would equal to the reference voltage $V_{REF}$. Therefore, in order to evaluate the ratio of the off-chip resistance $R_{EXT}$ to the unit resistance $R_{unit}$, the embodiment of the present invention adjusts the comparative current $I_{CON}$ by the successive approximation method according to the comparing result $V_{OUT}$ of the comparator 315 until the comparative voltage $V_{CON}$ equals to the reference voltage $V_{REF}$.

For example, the SAR 316 can perform binary search operation according to the comparing result $V_{OUT}$ of the comparator 315, and sequentially set the control signal FT[n:0] bit-by-bit from a most significant bit (MSB) to a least significant bit (LSB). Whenever the SAR 316 completes setting one bit of the control signal FT[n:0], the current calculation unit 314 would correspondingly adjust the comparative current $I_{CON}$. And before the SAR 316 sets the next bit, the comparative current $I_{CON}$ would remain fixed. Accordingly, the embodiment of the present invention can decide the number of the parallel-connected unit resistors $R_{unit}$ in FIG. 2 by evaluating the ratio of the off-chip resistance to the unit resistance.

Please further refer to FIG. 3. If the reference voltage $V_{REF}$ is a fixed voltage, the reference current $I_{REF}$ generated by the voltage-to-current conversion unit 313 can be expressed as:

$$I_{REF} = \frac{V_{DD} - V_{REF}}{R_{unit}} \quad (1)$$

where $V_{DD}$ is the supply voltage and $R_{unit}$ is the resistance of the unit resistor 311. Under this condition, the comparative current $I_{CON}$ generated by the current calculation unit 314 can be expressed as:

$$I_{CON} = I_{REF} \times \frac{N}{M} \quad (2)$$

where N is the number of units of the mirror currents generated by the current calculation unit 314. For example, if the switches SW1 and SW3 are on while the other switches are off, the number of units of the mirror currents are 5, i.e. 1+4, and so on. When the number of units of the mirror currents makes the reference voltage $V_{REF}$ equal to the comparative voltage $V_{CON}$ the voltage drops of the unit resistor 311 and the off-chip resistor 312 are also the same, i.e.:

$$I_{CON} \times R_{EXT} = I_{REF} \times R_{unit} \quad (3)$$

where $R_{EXT}$ is the resistance of the off-chip resistor 312. Substituting eq. (2) into eq. (3), the ratio of the unit resistor 311 to the off-chip resistor 312 can be expressed as:

$$\frac{R_{unit}}{R_{EXT}} = \frac{N}{M} \quad (4)$$

If the W/L ratio of the current reception element MN0 is 10 times the W/L ratio of the current mirror element MN1 and the resistance of the off-chip resistor 312 is 500 ohm, the relation between the unit resistor 311 and the off-chip resistor 312 becomes:

$$\frac{R_{EXT}}{10} = \frac{R_{unit}}{N} = 50 \quad (5)$$

From the above equation, parallel-connecting the unit resistors with the number the same as the number of the mirror currents obtains the matched resistance of 50 ohm. In other words, when the number of units of the mirror currents is adjusted by the successive approximation method to make the reference voltage $V_{REF}$ equal to the comparative voltage $V_{CON}$, the control signal FT [n:0] outputted by the SAR 316 simultaneously has the terminal resistor unit 20 connecting the same number of the unit resistors, so as to obtain the matched resistance of 50 ohm.

Figure 4:
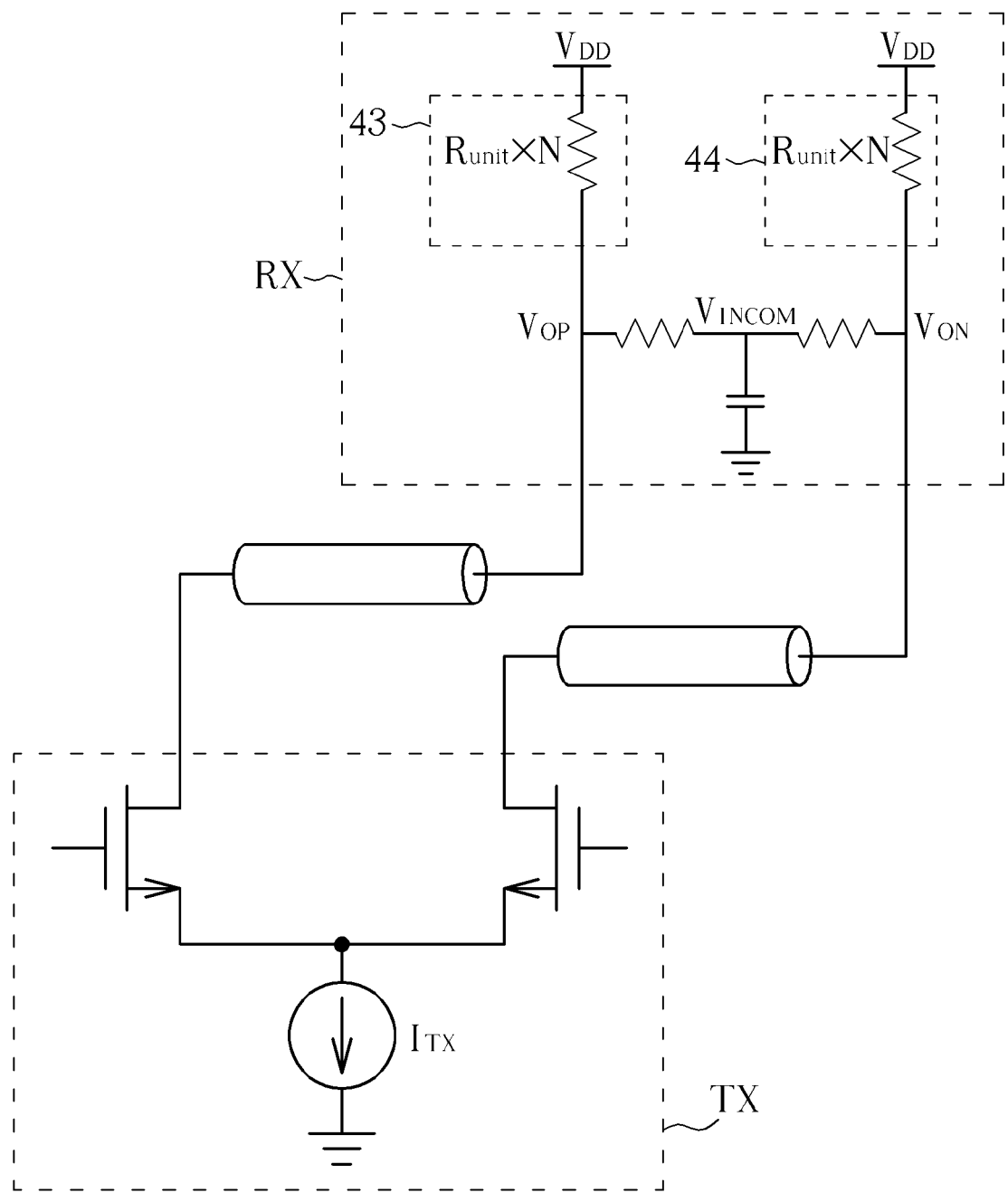
FIG. 4 is a schematic diagram of a transmission terminal and a reception terminal according to an embodiment of the present invention.

On the other hand, please refer to FIG. 4. FIG. 4 is a schematic diagram of a transmission terminal TX and a reception terminal RX according to an embodiment of the present invention. The transmission terminal TX transmits two differential signals with opposite polarity to the reception terminal RX, and two input terminals $V_{OP}$ and $V_{ON}$ of the reception terminal RX are individually coupled to terminal resistor units 43 and 44. In this embodiment, the terminal resistor units 43 and 44 can be individually realized by the terminal resistor unit 20 in FIG. 2. Under this condition, the embodiment of the present invention can use a common-mode voltage $V_{INCOM}$ of the input signal as the reference voltage $V_{REF}$ of the resistance evaluation unit 30. As known by those skilled in the art, two identical resistors are usually used to connect across the input terminals $V_{OP}$ and $V_{ON}$ of the reception terminal RX to obtain the common-mode voltage $V_{INCOM}$ of the input signal. Since the resistance provided by the terminal resistor units 43 and 44 during the resistance evaluation process is a dynamic value, the common-mode voltage $V_{INCOM}$ of the input signal follows its variation as well, which can be expressed as:

$$V_{INCOM} = \frac{V_{OP} + V_{ON}}{2} = V_{DD} - \frac{I_{TX}}{2} \times \frac{R_{unit}}{N} \quad (6)$$

where $I_{TX}$ is a common-mode current provided by the transmission terminal TX, N is the number of units of the mirror currents generated by the current calculation unit 314 and $$\frac{R_{unit}}{N}$$

is the resistance provided by the terminal resistor units 43 and 44.

Under this condition, the reference current $I_{REF}$ generated by the voltage-to-current converter 313 is inversely proportional to N, which can be expressed as:

$$I_{REF} = \frac{V_{DD} - V_{REF}}{R_{unit}} = \frac{I_{TX}}{2} \times \frac{1}{N} \quad (7)$$

However, since the comparative current $I_{CON}$ generated by mirroring the reference current $I_{REF}$ is N times the reference current $I_{REF}$, the comparative current $I_{CON}$ is thus a fixed value and the comparative voltage $V_{CON}$ doest not change with the number of units of the mirror currents, which can be expressed as:

$$I_{CON} = I_{REF} \times \frac{N}{10} = \frac{I_{TX}}{20} \quad (8)$$

$$V_{CON} = V_{DD} - I_{CON} \times R_{EXT} = V_{DD} - \frac{I_{TX}}{20} \times R_{EXT} \quad (9)$$

Therefore, when the number of units of the mirror currents is adjusted by the successive approximation method to make the comparative voltage $V_{CON}$ equal to the reference voltage $V_{REF}$, the relation between the unit resistance 311 and the off-chip resistance 312 becomes:

$$\frac{R_{EXT}}{10} = \frac{R_{unit}}{N} = 50 \quad (5)$$

Accordingly, the control signal FT[n:0] of the SAR 316 also has the terminal resistor unit 20 connecting the same number of unit resistors in parallel to obtain the matched resistance of 50 ohm.

Therefore, the embodiment of the present invention can evaluate the ratio of the off-chip resistor to the on-chip unit resistor by the successive approximation method, and decides the number of parallel-connected unit resistors according to the evaluation result to obtain the terminal resistance matched with the characteristic resistance of transmission media (ex. 50 ohm). As a result, the present invention can provide the best energy transmission efficiency for the high-speed data transmission interface and avoid unnecessary signal reflection during transmission.

Figure 5:
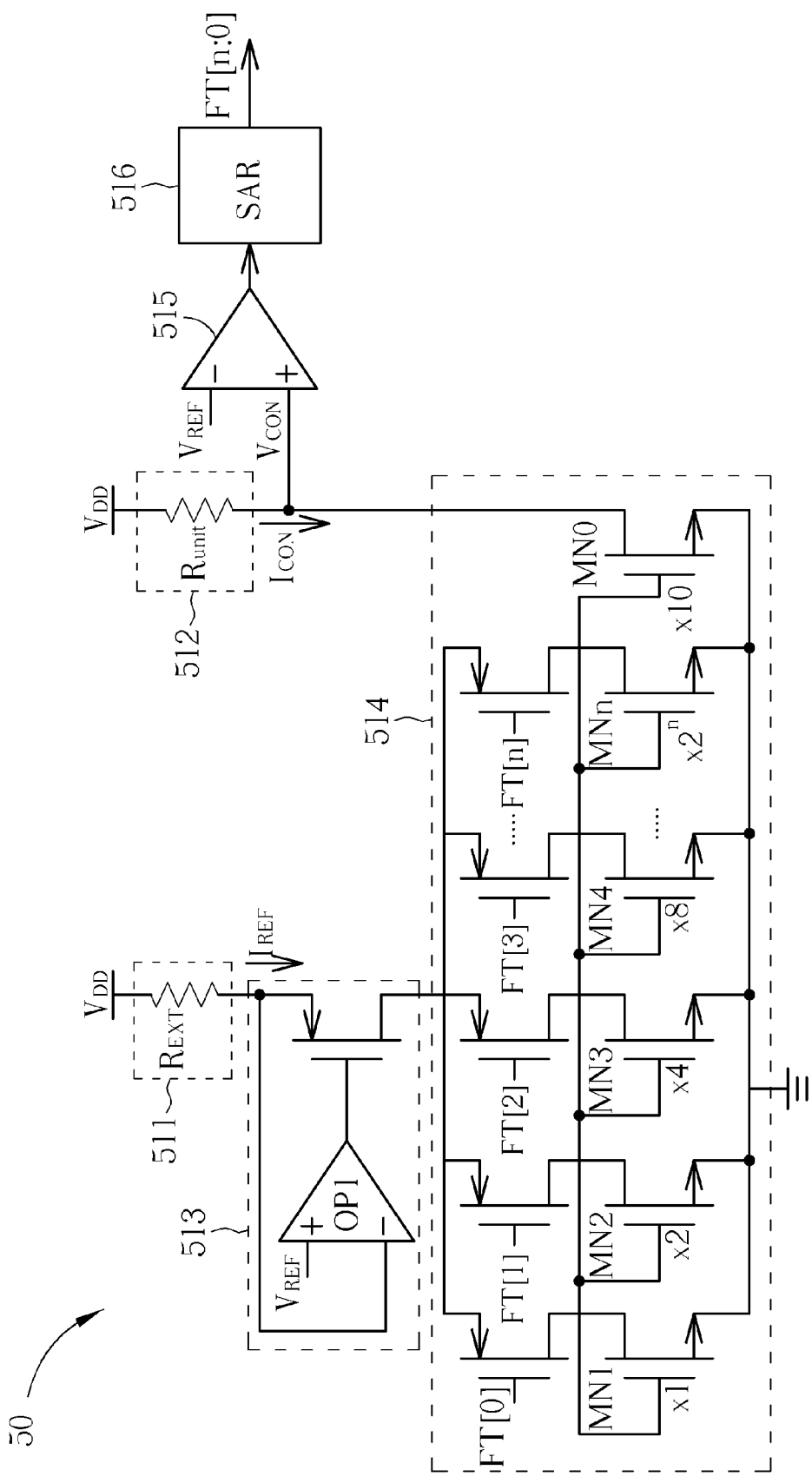
FIG. 5 is a schematic diagram of a resistance evaluation unit according to another embodiment of the present invention.
Figure 7:
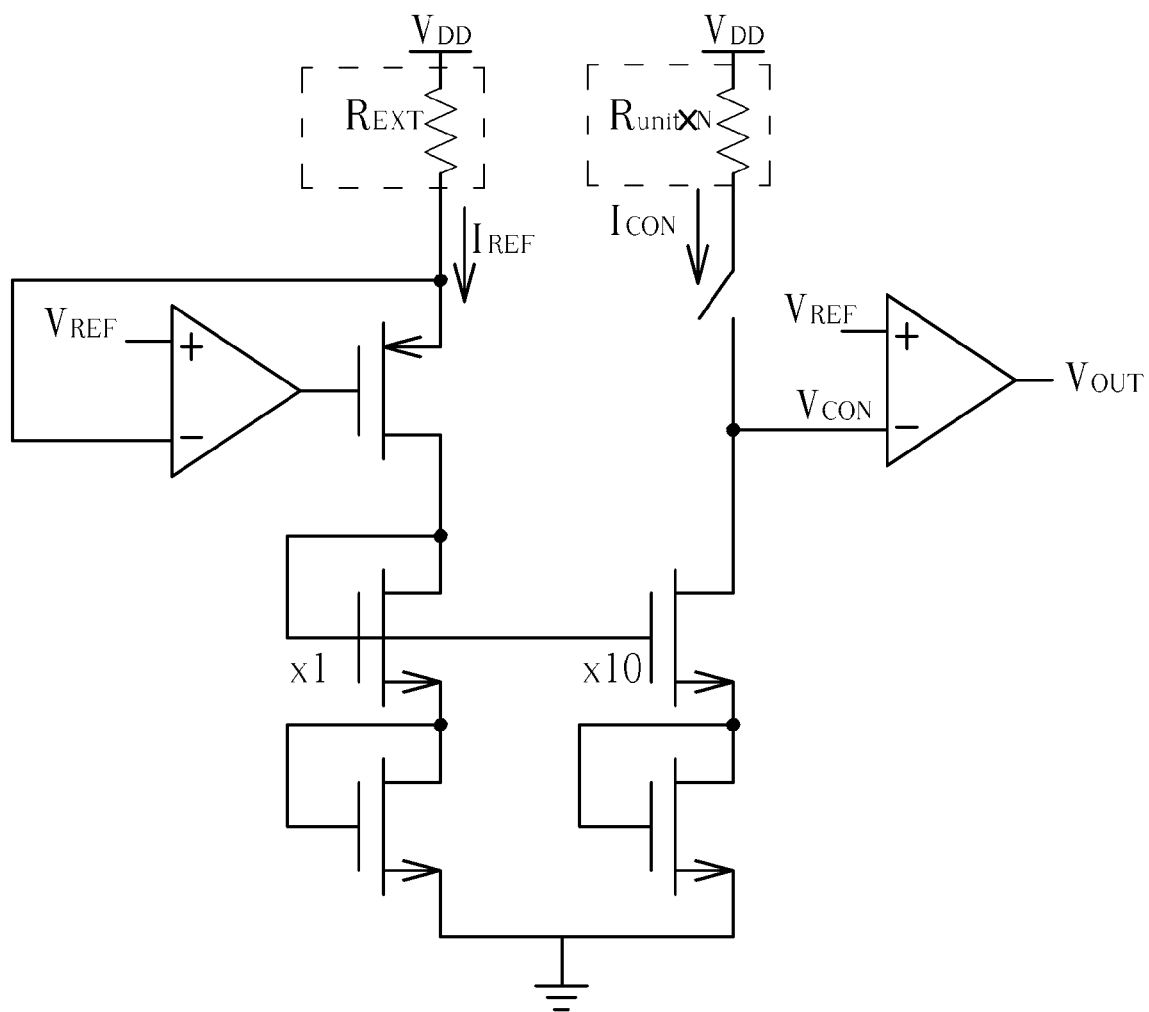
FIG. 7 is a schematic diagram of a resistance evaluation unit according to another embodiment of the present invention.

Please note that realization of the resistance evaluation unit 12 is not limited to the resistance evaluation unit 30 in FIG. 3. In the other embodiment of the present invention, the resistor 111 can be an off-chip resistor, while the resistor 112 is realized by the on-chip unit resistor. For example, please refer to FIG. 5. FIG. 5 is a schematic diagram of a resistance evaluation unit 50 according to another embodiment of the present invention. The resistance evaluation unit 50 is utilized for realizing the resistance evaluation unit 11 in FIG. 1, and includes an off-chip resistor 511, a unit resistor 512, a voltage-to-current converter 513, a current calculation unit 514, a comparator 515 and a SAR 516. Similar to the resistance evaluation unit 30 in FIG. 3, the resistance evaluation unit 50 also evaluates the ratio of the off-chip resistor 511 to the unit resistor 512 by the successive approximation method to decide the number of parallel-connected unit resistors $R_{unit}$ in FIG. 2. Of course, those of ordinary skill in the art can also modify and alter the resistance evaluation unit 12 according to practical requirements, as shown in FIG. 7, which also belongs to the scope of the present invention.

Figure 6:
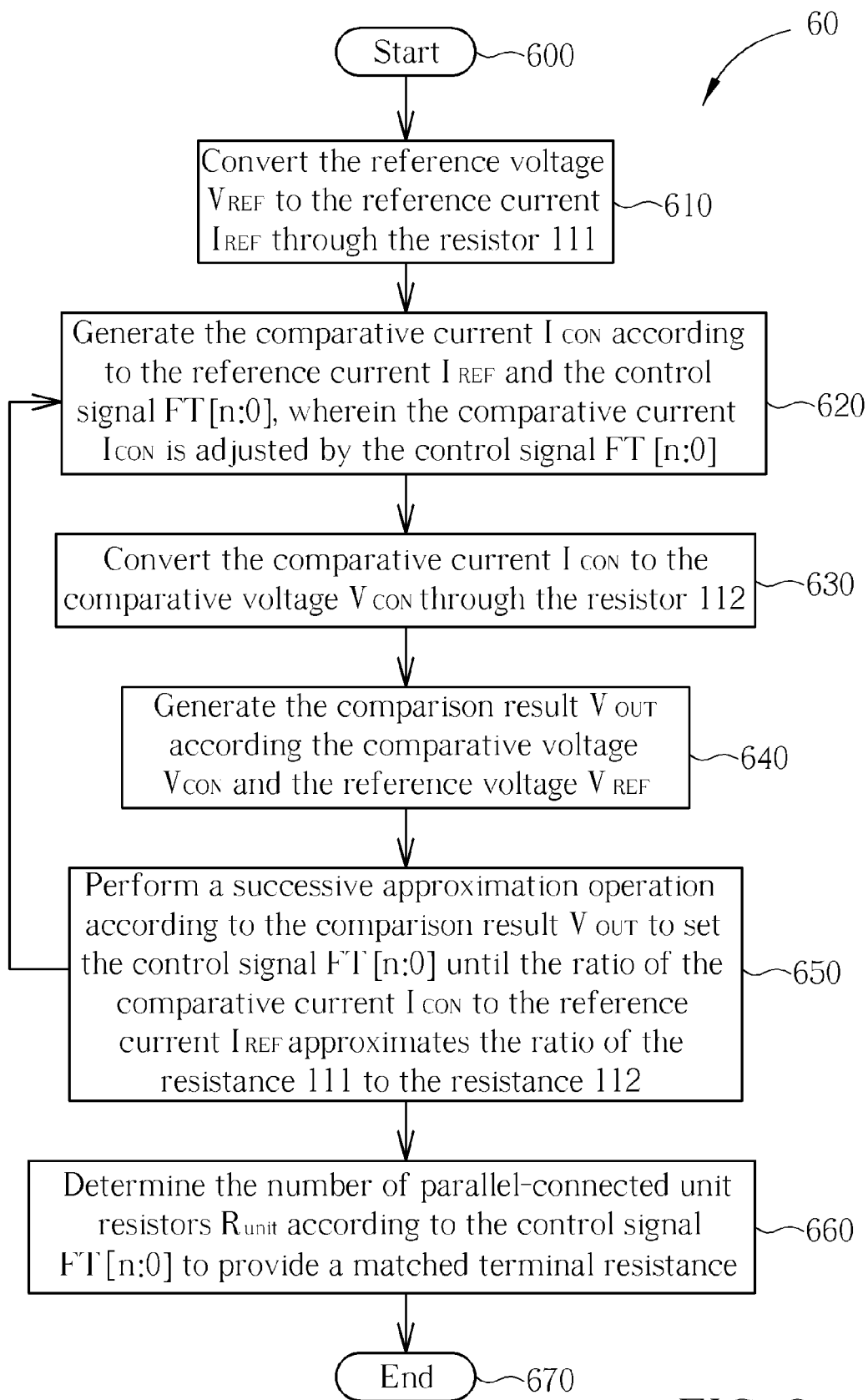
FIG. 6 is a schematic diagram of an impedance adjustment process according to an embodiment of the present invention.

Please refer to FIG. 6. FIG. 6 is a schematic diagram of an impedance adjustment process 60 according to an embodiment of the present invention. The impedance adjustment process 60 is an operation flow of the resistance adjustment circuit 10, for adjusting a terminal resistance to a matched value. The resistance adjustment process 60 includes the following steps:

Step 600: Start.

Step 610: Convert the reference voltage $V_{REF}$ to the reference current $I_{REF}$ through the resistor 111.

Step 620: Generate the comparative current $I_{CON}$ according to the reference current $I_{REF}$ and the control signal FT[n:0], wherein the comparative current $I_{CON}$ is adjusted by the control signal FT [n:0].

Step 630: Convert the comparative current $I_{CON}$ to the comparative voltage $V_{CON}$ through the resistor 112.

Step 640: Generate the comparison result $V_{OUT}$ according the comparative voltage $V_{CON}$ and the reference voltage $V_{REF}$.

Step 650: Perform a successive approximation operation according to the comparison result $V_{OUT}$ to set the control signal FT [n:0] until the ratio of the comparative current $I_{CON}$ to the reference current $I_{REF}$ approximates the ratio of the resistance 111 to the resistance 112.

Step 660: Determine the number of parallel-connected unit resistors $R_{unit}$ according to the control signal FT[n:0] to provide a matched terminal resistance.

Step 670: End.

As for detailed operation of the impedance adjustment process 60, please refer to the resistance evaluation unit 10 mentioned above, which is not narrated again herein. It is worth noting that the resistors 111 and 112 must be realized by a unit resistor and an off-chip resistor, respectively. For example, when the resistor 111 is realized by a unit resistor, the resistor 112 must be realized by a precise off-chip resistor. On the contrary, when the resistor 111 is realized by a precise off-chip resistor, the resistor 112 must have the same impedance and process variations with the unit resistors. Accordingly, the present invention can evaluate the ratio of the off-chip resistor to the unit resistor for determining the number of parallel-connected unit resistors, so as to obtain precise terminal resistance.

In summary, the present invention evaluates the ratio of the off-chip resistor to the on-chip unit resistor by the successive approximation method and determines the number of parallel-connected unit resistors according to the evaluation result to obtain the terminal resistance matched with the characteristic resistance of the transmission media. As a result, the present invention can provide the best energy transmission efficiency for the high-speed data transmission interface and avoid unnecessary signal reflection during transmission.

Those skilled in the art will readily observe that numerous modifications and alterations of the device and method may be made while retaining the teachings of the invention.

What is claimed is:

1. An impedance adjustment circuit for adjusting terminal resistance, the impedance adjustment circuit comprising:
   a resistance evaluation unit comprising:
      a first resistor;
      a voltage-to-current conversion unit, coupled to a reference voltage and the first resistor, for converting the reference voltage to a reference current through the first resistor;
      a current calculation unit, coupled to the voltage-to-current conversion unit, for generating a comparative current according to the reference current and a control signal, wherein the comparative current is adjusted by the control signal;
      a second resistor, coupled to the current calculation unit, for converting the comparative current to a comparative voltage;
      a comparator, coupled to the second resistor and the reference voltage, for generating a comparing result according to the comparative voltage and the reference voltage; and
      a successive approximation register (SAR), coupled to the comparator and the current calculation unit, for performing a successive approximation operation according to the comparing result to set the control signal until a ratio of the comparative current to the reference current approximates a ratio of the first resistor to the second resistor; and
   a terminal resistor unit, coupled to the resistance evaluation unit, comprising a plurality of unit resistors, the terminal resistor unit determining the number of parallel-connected resistors of the plurality of unit resistors according to the control signal to provide a matched terminal resistance.

2. The impedance adjustment circuit of claim 1, wherein the first resistor and the plurality of unit resistors have the same impedance values and process variations, and the second resistor is an off-chip resistor.

3. The impedance adjustment circuit of claim 1, wherein the first resistor is an off-chip resistor, and the second resistor and the plurality of unit resistors have the same impedance values and process variations.

4. The impedance adjustment circuit of claim 1, wherein the plurality of unit resistors form a plurality of resistor groups, each resistor group comprises a distinct number of parallel-connected unit resistors, and the number of parallel-connected unit resistors comprised by each of the plurality of resistor groups increases quadratically in sequence.

5. The impedance adjustment circuit of claim 4, wherein the terminal resistor unit further comprises a plurality of switches, individually coupled to the plurality of resistor groups and the resistance evaluation unit, for controlling connection of the plurality of resistor group to the resistance evaluation unit according to the control signal to determine the number of parallel-connected unit resistors of the plurality of unit resistors.

6. The impedance adjustment circuit of claim 1, wherein the current calculation unit further comprises:
- a current reception element, for receiving the reference current;
- a plurality of current mirror elements, coupled to the current reception element, for generating a plurality of mirror currents proportional to the reference current according to the reference current, wherein magnitudes of the plurality of mirror currents increase quadratically in sequence; and
- a plurality of switches, individually coupled to the current mirror elements, for outputting corresponding mirror currents from the plurality of mirror currents according to the control signal to generate the comparative current.

7. The impedance adjustment circuit of claim 1, wherein the voltage-to-current conversion unit further comprises:
- an operation amplifier having a positive input terminal coupled to the reference voltage, a negative input terminal coupled to the first resistor, and a output terminal; and
- a transistor having a source terminal coupled to the first resistor and the negative input terminal of the operation amplifier, agate terminal coupled to the output terminal of the operation amplifier, and a drain terminal coupled to the current calculation unit.

8. The impedance adjustment circuit of claim 1, wherein the reference voltage is a fixed voltage.

9. The impedance adjustment circuit of claim 1, wherein the reference voltage is a common-mode voltage of a differential input signal, and the common-mode voltage is generated according to the matched resistance provided by the terminal resistor unit.

10. The impedance adjustment circuit of claim 1, wherein the control signal comprises a plurality of bits, and the successive approximation register sequentially sets values for the plurality of bits from a most significant bit (MSB) to a least significant bit (LSB).

11. An impedance adjustment method for adjusting terminal resistance, the impedance adjustment method comprising:
- converting a reference voltage to a reference current through a first resistor;
- generating a comparative current according to the reference current and a control signal, wherein the comparative current is adjusted by the control signal;
- converting the comparative current to a comparative voltage through a second resistor;
- generating a comparing result according the comparative voltage and the reference voltage;
- performing a successive approximation operation according to the comparing result to set the control signal until a ratio of the comparative current to the reference current approximates a ratio of the first resistor to the second resistor; and
- determining the number of parallel-connected resistors of a plurality of unit resistors according to the control signal to provide a matched terminal resistance.

12. The method of claim 11, wherein the first resistor and the plurality of unit resistors have the same impedance values and process variations, and the second resistor is an off-chip resistor.

13. The method of claim 11, wherein the first resistor is an off-chip resistor, and the second resistor and the plurality of unit resistors have the same impedance values and process variations.

14. The method of claim 11, wherein the unit resistors form a plurality of resistor groups, each resistor group comprises a distinct number of parallel-connected unit resistors, and the number of parallel-connected unit resistors comprised by each of the plurality of resistor groups increases quadratically in sequence.

15. The method of claim 14, wherein the step of determining the number of the parallel-connected resistors of the plurality of unit resistors according to the control signal comprises:
- controlling connection of the plurality parallel-connected resistor groups according to the control signal to determine the number of the parallel-connected resistors of the plurality of unit resistors.

16. The method of claim 11, wherein the step of generating the comparative current according to the reference current and the control signal comprises:
- generating a plurality of mirror currents proportional to the reference current according to the reference current, wherein magnitudes of the plurality of mirror currents increase quadratically in sequence; and
- outputting corresponding mirror currents of the plurality of mirror currents according to the control signal to generate the comparative current.

17. The method of claim 11, wherein the reference voltage is a fixed voltage.

18. The method of claim 11, wherein the reference voltage is a common-mode voltage of a differential input signal, and the common-mode voltage is generated according to the matched resistance.

19. The method of claim 11, wherein the control signal has a plurality of bits, and the successive approximation register sequentially sets values of the plurality bits from a most significant bit (MSB) to a least significant bit (LSB).

* * * * *